(12) United States Patent
Park et al.

(10) Patent No.: US 8,129,826 B2
(45) Date of Patent: Mar. 6, 2012

(54) SEMICONDUCTOR PACKAGE APPARATUS HAVING REDISTRIBUTION LAYER

(75) Inventors: Sang-Wook Park, Chungcheongnam-do (KR); Min-Young Son, Chungcheongnam-do (KR); Hyeong-Seob Kim, Chungcheongnam-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 494 days.

(21) Appl. No.: 12/355,587

(22) Filed: Jan. 16, 2009

(65) Prior Publication Data

US 2009/0184410 A1  Jul. 23, 2009

(30) Foreign Application Priority Data

Jan. 17, 2008  (KR) .................. 10-2008-0005330

(51) Int. Cl.
*H01L 23/495* (2006.01)
*H01L 23/48* (2006.01)

(52) U.S. Cl. .. 257/676; 257/666; 257/777; 257/E23.037

(58) Field of Classification Search .................. 257/676, 257/666, 777, E23.037
See application file for complete search history.

(56) References Cited

U.S. PATENT DOCUMENTS

| | | | | |
|---|---|---|---|---|
| 5,422,435 A | * | 6/1995 | Takiar et al. | 174/521 |
| 5,528,083 A | * | 6/1996 | Malladi et al. | 257/786 |
| 5,569,956 A | * | 10/1996 | Chillara et al. | 257/668 |
| 6,208,018 B1 | * | 3/2001 | Ma et al. | 257/669 |
| 6,215,182 B1 | * | 4/2001 | Ozawa et al. | 257/723 |
| 6,514,794 B2 | | 2/2003 | Haba et al. | |
| 6,570,249 B1 | * | 5/2003 | Liao et al. | 257/724 |
| 7,781,873 B2 | * | 8/2010 | Koh et al. | 257/673 |
| 2005/0200007 A1 | * | 9/2005 | Liu | 257/724 |

FOREIGN PATENT DOCUMENTS

| | | |
|---|---|---|
| JP | 2006-086149 | 3/2006 |
| KR | 2004-0075245 | 8/2004 |

OTHER PUBLICATIONS

English language abstract of Korean Publication No. 2004-0075245.
English language abstract of Japanese Publication No. 2006-086149.

* cited by examiner

*Primary Examiner* — Nitin Parekh
(74) *Attorney, Agent, or Firm* — Muir Patent Consulting, PLLC

(57) ABSTRACT

Provided is a semiconductor package apparatus having a redistribution layer. The apparatus includes at least one or more semiconductor chips, a packing part protecting the semiconductor chips, and a support part supporting the semiconductor chips. The apparatus also includes external terminals extending outside the packing part, redistribution layers installed between the semiconductor chips and the support part and including redistribution paths, first signal transmitting units, and second signal transmitting units. The first signal transmitting units transmitting electrical signals generated from the semiconductor chips to the redistribution paths of the redistribution layers, and the second signal transmitting units transmit the electrical signals from the redistribution paths to the external terminals. Therefore, a size and a thickness of the semiconductor package apparatus can be reduced, and processes can be simplified to improve productivity.

22 Claims, 6 Drawing Sheets

SEMICONDUCTOR PACKAGE APPARATUS HAVING REDISTRIBUTION LAYER

CROSS-REFERENCE TO RELATED PATENT APPLICATION

This application claims the benefit of Korean Patent Application No. 10-2008-0005330, filed on Jan. 17, 2008, in the Korean Intellectual Property Office, the disclosure of which is incorporated herein in its entirety by reference.

BACKGROUND OF THE INVENTION

1. Field of the Invention

The present invention relates to a semiconductor package apparatus having a redistribution layer, and more particularly, to a semiconductor package apparatus having a redistribution layer for reducing the size and thickness of the semiconductor package apparatus and for reducing the number of fabrication processes in order to improve productivity.

2. Description of the Related Art

In general, packaging processes are used to seal semiconductor chips having designed micro-circuits using a sealing material such as plastic resins, ceramic materials, or the like so that the semiconductor chips may be properly installed in electronic devices. Thus, these packaging processes are important to ensure that the semiconductors and resulting electronic devices are part of reliable final consumer products.

A semiconductor package apparatus fabricated using such packaging processes can protect semiconductor chips from outer environments. The semiconductor package apparatus should connect the semiconductor chips to parts of the semiconductor package apparatus while allowing heat generated during operations of the semiconductor chips to be dispersed in order to both secure the chips to the package apparatus and enhance the thermal and electrical performances of the semiconductor chips.

Technology for stacking semiconductor chips in a semiconductor package apparatus has been developed utilizing wires to transmit and receive electrical signals between the semiconductor chips and external terminals. In this case, a spacer tape is often used between a semiconductor chip and a neighboring semiconductor chip in order to secure a space necessary for wire bonding. However, the use of spacer tape increases the stack height of the semiconductor chips and adds an additional process of attaching the spacer tape during fabrication of the semiconductor packages. As a result, productivity may be decreased.

SUMMARY OF THE INVENTION

Embodiments of the present invention provide a semiconductor package apparatus having a redistribution layer for stacking semiconductor chips in a step shape and enabling electrical connections to external terminals using the redistribution layers to reduce the size and thickness of the semiconductor package apparatus while further reducing the number of fabrication processes.

According to an embodiment of the present invention, a semiconductor package apparatus may include at least one semiconductor chip, a packing part protecting the semiconductor chip, a support part supporting the semiconductor chip, and external terminals extending outside the packing part. The semiconductor package may further include a redistribution layer formed between the semiconductor chip and the support part. The redistribution layer may include redistribution paths. First signal transmitting units transmitting electrical signals generated from the semiconductor chips to the redistribution paths of the redistribution layers, and second signal transmitting units transmitting the electrical signals transmitted to the redistribution paths to the external terminals may also be included in the semiconductor package.

In other embodiments, a plurality of semiconductor chips may be stacked in a step shape to expose chip bonding pads upward, wherein the chip bonding pads are formed at edges of active surfaces of the semiconductor chips.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

A semiconductor package apparatus having a redistribution layer according to exemplary embodiments of the present invention will now be described in detail with reference to the attached drawings.

Figure 1:
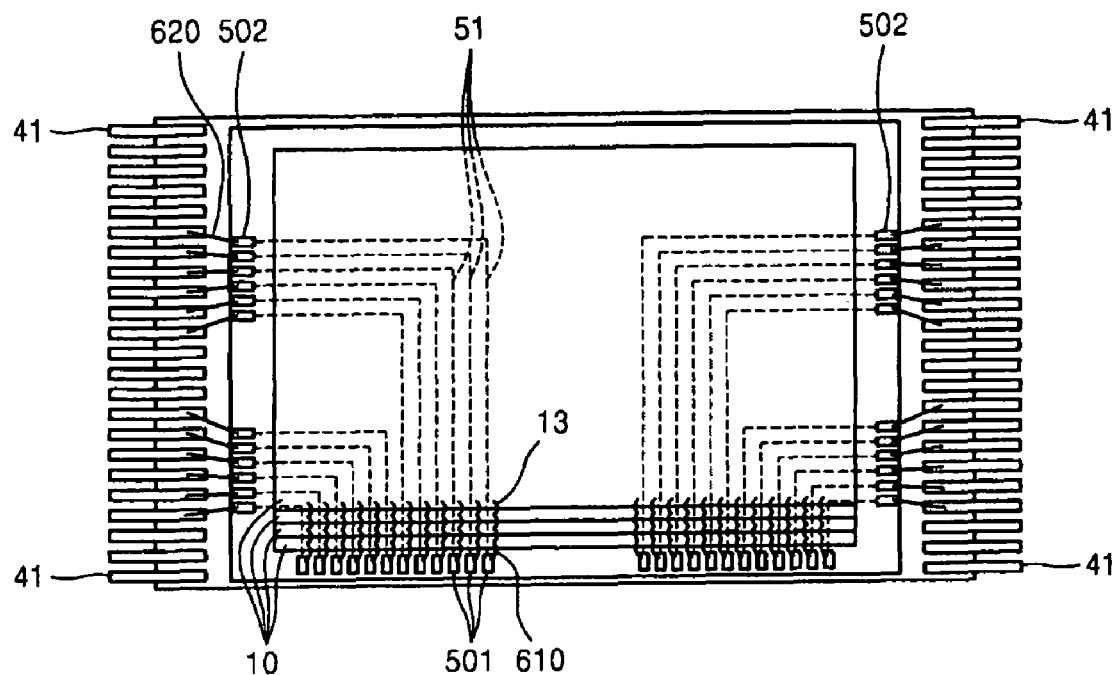
FIG. 1 is a plan view of a semiconductor package apparatus having a redistribution layer according to an exemplary embodiment of the present invention.
Figure 2:
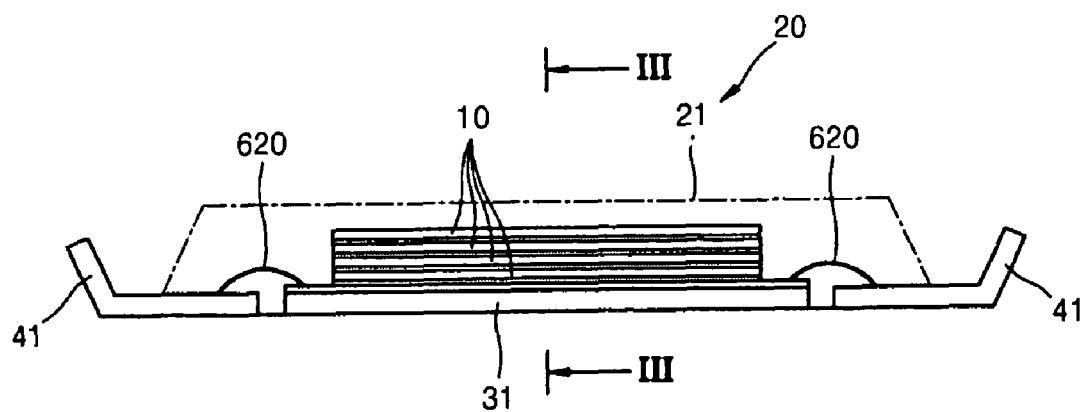
FIG. 2 is a side view of the semiconductor package apparatus having the redistribution layer shown in FIG. 1.
Figure 3:
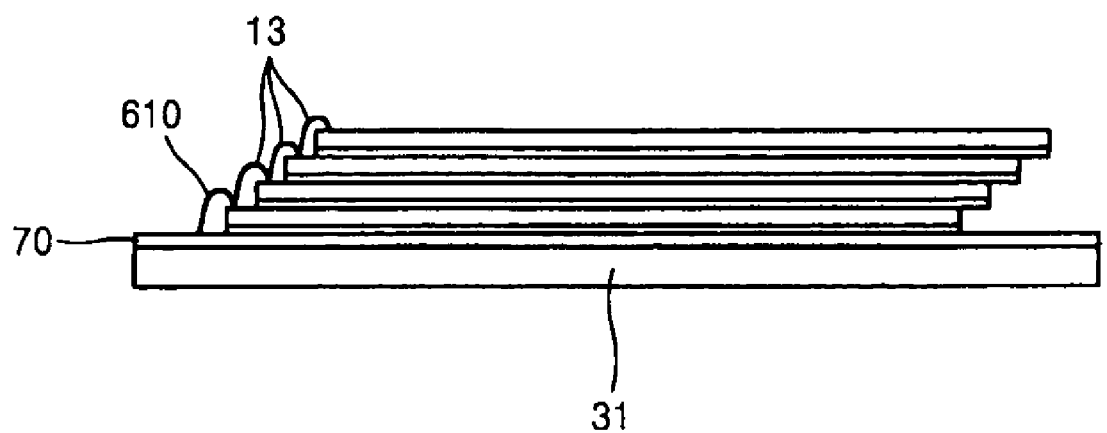
FIG. 3 is a cross-sectional view taken along line III-III of FIG. 2.
Figure 4:
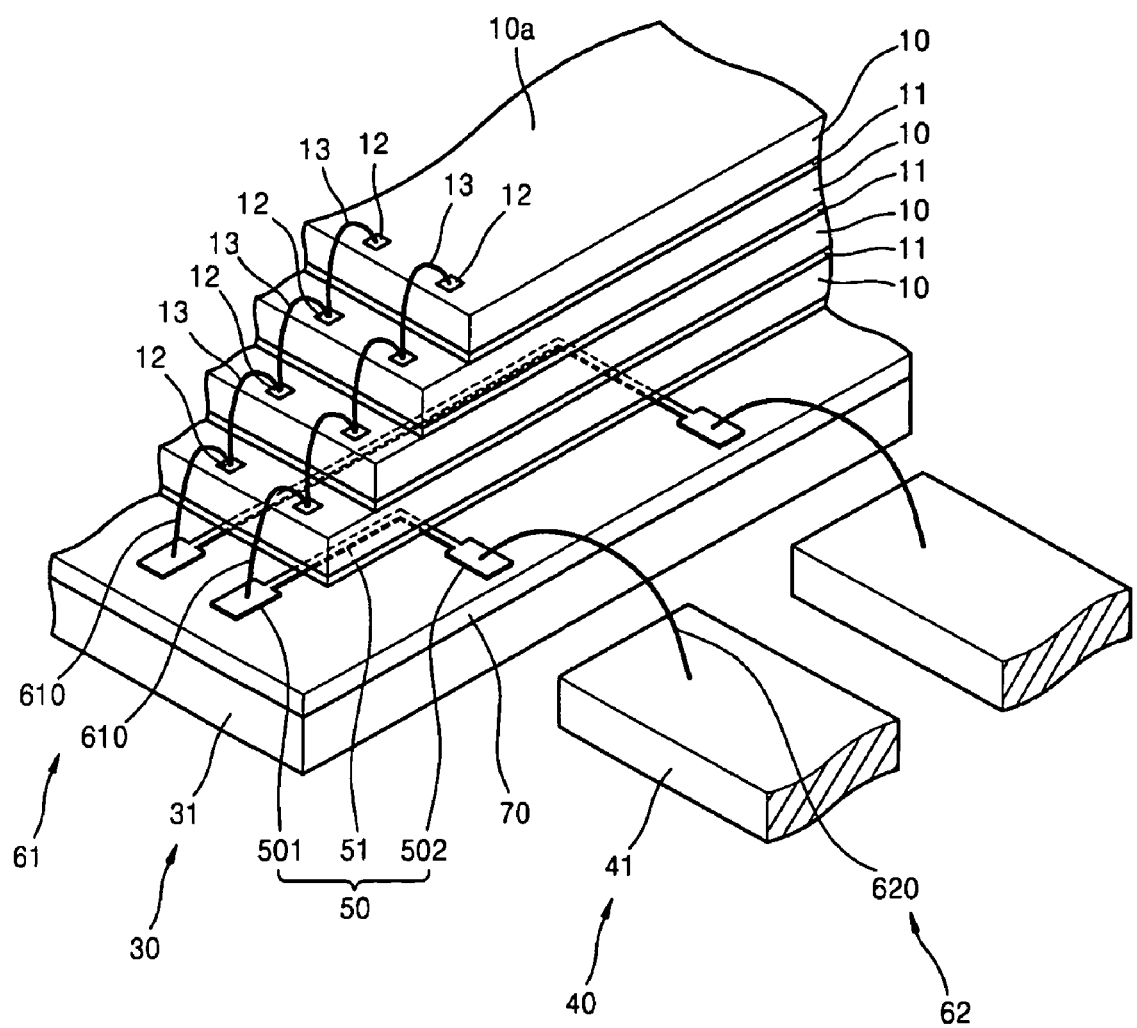
FIG. 4 is an enlarged perspective view of a portion of the semiconductor package apparatus having the redistribution layer shown in FIG. 1.

FIG. 1 is a plan view of a semiconductor package apparatus having a redistribution layer according to an exemplary embodiment of the present invention. FIG. 2 is a side view of the semiconductor package apparatus having the redistribution layer shown in FIG. 1. FIG. 3 is a cross-sectional view taken along line III-III of FIG. 2. FIG. 4 is an enlarged perspective view of a portion of the semiconductor package apparatus having the redistribution layer shown in FIG. 1.

Referring to FIGS. 1 through 4, a semiconductor package apparatus having a redistribution layer according to an exemplary embodiment of the present invention includes at least one or more semiconductor chips 10 (four in the drawings), a packing part 20, a support part 30, and external terminals 40. The semiconductor chips 10 are stacked in a plurality of layers by interlayer adhesives 11, the packing part 20 protects the semiconductor chips 10, the support part 30 supports the semiconductor chips 10, and the external terminals 40 extend outside the packing part 20.

In particular, the semiconductor package apparatus of the present exemplary embodiment includes redistribution layers 50 and first and second signal transmitting units 61 and 62.

Here, the redistribution layers 50 are installed between the semiconductor chips 10 and the support part 30 and include redistribution paths 51.

As illustrated in FIG. 4, the redistribution layers 50 may be installed beneath the lowermost semiconductor chip 10 of the semiconductor chips 10. The first signal transmitting units 61 may transmit electrical signals generated from the semiconductor chips 10 to the redistribution paths 51 of the redistribution layers 50. The second signal transmitting units 62 may transmit the electrical signals transmitted to the redistribution paths 51 to the external terminals 40.

Here, as shown in FIG. 4, the four semiconductor chips 10 are stacked in a step shape so as to form chip bonding pads 12 at the side edges of the active surfaces 10a of the chip. This stacked configuration may also expose the chip bonding pads 12 on respective steps of the semiconductor chips 10.

In other words, the semiconductor chips 10 may be exposed in step shapes to facilitate efficient wire bonding manufacturing techniques. For example, the bond wires may be efficiently bonded to the chip bonding pads 12 because of the sufficient space created by this configuration in which wire bonding equipment can move. Thus, spacer tape, etc. for separating the semiconductor chips from one another for wire bonding is not required. As such, a stack height of the semiconductor chips 10 may be considerably reduced.

As shown in FIG. 4, the chip bonding pads 12 may be electrically connected to one another through interlayer wires 13 due to the step-shaped stack. As shown in FIG. 4, the support part 30 may be a die paddle 31 that is formed of substantially the same metal material as that of which the external terminals 40 are formed. Here, the external terminals 40 and the die paddle 31 may be simultaneously formed using substantially the same metalworking process, which may reduce the manufacturing cost. The redistribution layers 50 shown in the embodiment illustrated in FIG. 4 may be formed on a surface of a redistribution film 70.

Figure 5:
FIG. 5 is a cross-sectional view of a redistribution film of FIG. 4.
Figure 6:
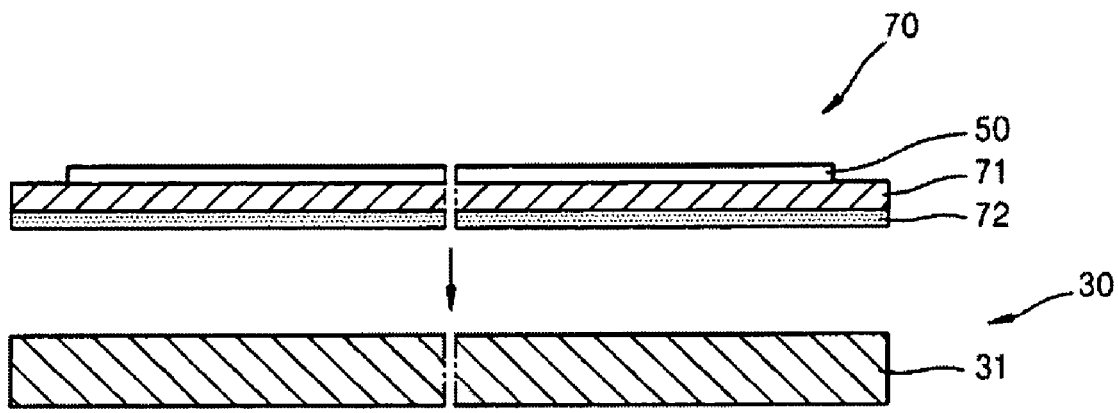
FIG. 6 is a cross-sectional view of a support part to which the redistribution film of FIG. 4 is adhered, according to an exemplary embodiment of the present invention.
Figure 7:
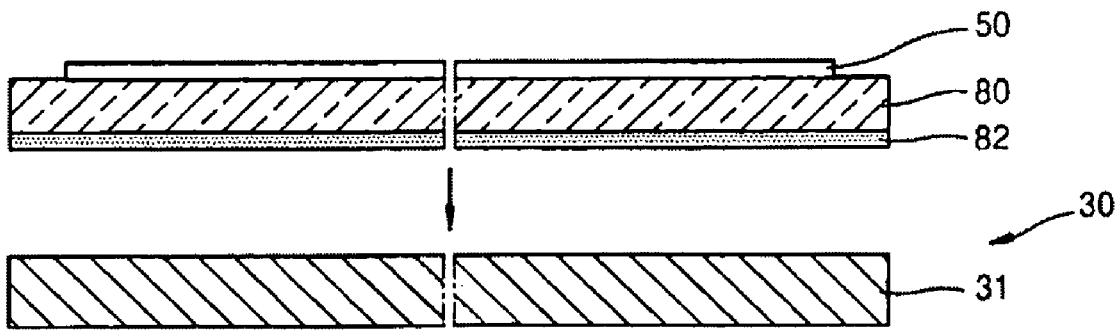
FIG. 7 is a cross-sectional view of a semiconductor package apparatus having a redistribution layer according to another exemplary embodiment of the present invention.
Figure 8:
FIG. 8 is a cross-sectional view of a semiconductor package apparatus having a redistribution layer according to another exemplary embodiment of the present invention.
Figure 9:
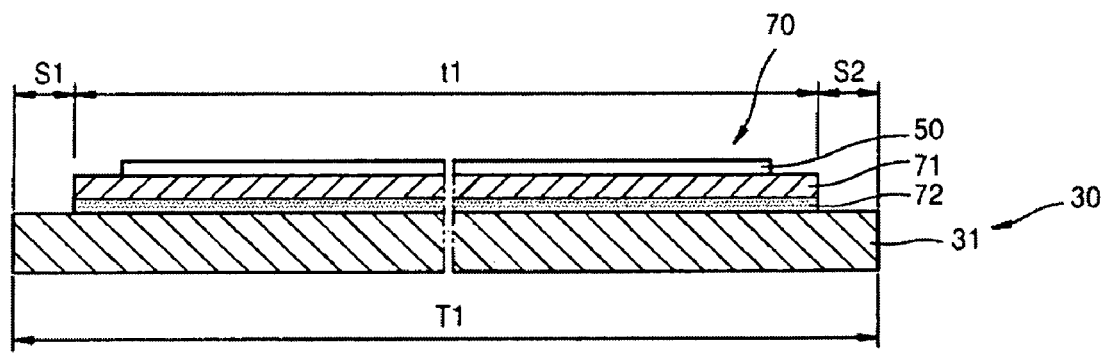
FIG. 9 is a cross-sectional view of a support part to which the redistribution film of FIG. 4 is adhered, according to an exemplary embodiment of the present invention.
Figure 10:
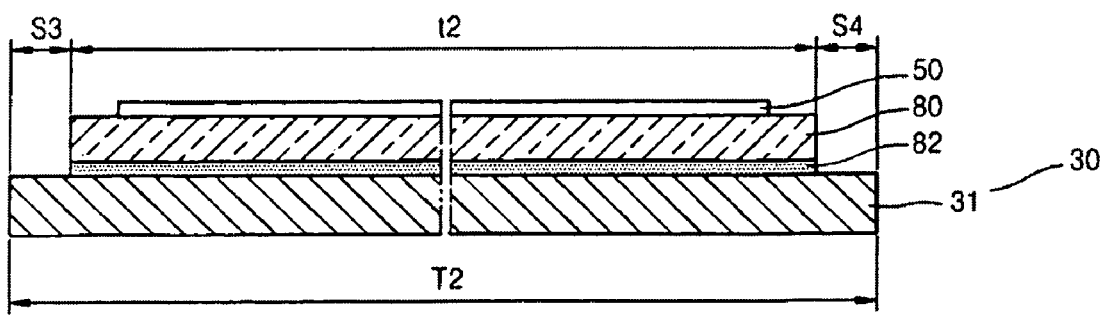
FIG. 10 is a cross-sectional view of semiconductor package apparatus having a redistribution layer, according to another exemplary embodiment of the present invention.

FIG. 5 is a cross-sectional view of a redistribution film of FIG. 4. FIG. 6 is a cross-sectional view of a support part to which the redistribution film of FIG. 4 is adhered, according to an exemplary embodiment of the present invention. FIG. 7 is a cross-sectional view of a semiconductor package apparatus having a redistribution layer according to another exemplary embodiment of the present invention. FIG. 8 is a cross-sectional view of a semiconductor package apparatus having a redistribution layer according to another exemplary embodiment of the present invention. FIG. 9 is a cross-sectional view of a support part to which the redistribution film of FIG. 4 is adhered, according to an exemplary embodiment of the present invention. FIG. 10 is a cross-sectional view of semiconductor package apparatus having a redistribution layer, according to another exemplary embodiment of the present invention.

Referring to FIGS. 5 through 10, the redistribution film 70 may include the redistribution layers 50 (that include, with reference to FIG. 4, redistribution paths 51), a core layer 71 that supports the redistribution layers 50, and a film adhesive layer 72 that attaches the core layer 71 to the support part 30 (FIG. 4).

The core layer 71 may be formed of polyimide that has thermal stability, a sufficient moisture absorption rate, and good adhesive strength with the packing part 20.

Therefore, as shown in FIG. 6, the redistribution film 70 may adhere to the support part 30, and the semiconductor chips 10 may be stacked on the redistribution film 70.

As shown in FIG. 9, the redistribution film 70 may have a size t1 smaller than a size T1 of the support part 30 so that sides S1 and S2 of the support part 30 contact the packing part 20 (FIG. 2).

Therefore, although the adhesive strength between the redistribution film 70 and the packing part 20 may be weakened, the sides S1 and S2 of the support part 30 may be firmly adhered to the packing part 20 to prevent separation of the parts.

As shown in FIG. 7, redistribution layers 50 of a semiconductor package apparatus having a redistribution layer according to another exemplary embodiment of the present invention may be formed on a surface of a printed circuit board (PCB) 80. Here, the PCB 80 adheres to the support part 30 through a board adhesive layer 82.

Here, the PCB 80 and board adhesive layer 82 may replace core layer 71 and film adhesive layer 72 of the redistribution film 70. In general, an alternate redistribution layer based on PCB 80 and board adhesive layer 82 may be thicker, may be manufactured at lower cost, and may be more easily treated than a redistribution layer based on core layer 71 and film adhesive layer 72.

As shown in FIG. 10, the PCB 80 may have a size t2 smaller than a size T2 of the support part 30 so that sides S3 and S4 of the support part 30 contact the packing part 20 (FIG. 2).

Here, the redistribution layers 50 may be formed using a general printing method when the PCB 80 is manufactured.

As shown in FIG. 8, the support part 30 of a semiconductor package apparatus having a redistribution layer according to another exemplary embodiment of the present invention may be a PCB 32 having a surface on which the redistribution layers 50 are formed.

In other words, the PCB 32 may replace the die paddle 31 to support the semiconductor chips 10 and the redistribution layers 50.

In this case, the PCB 32 may have enough strength and durability to support and protect the semiconductor chips 10.

Referring again to FIGS. 2 and 4, the external terminals 40 may be leads 41 that are formed of a metal material. The leads 41 may be exposed package type leads.

Also, the packing part 20 may be a sealing material 21 that is formed of a resin material.

The redistribution layers 50 according to an embodiment of the present invention will now be described in more detail with reference to FIG. 4. First bond fingers 501 may be formed at first ends of the redistribution paths 51 of the redistribution layers 50, and second bond fingers 502 may be formed at second ends of the redistribution paths 51.

The first signal transmitting units 61 of FIG. 4 may be first wires 610 that connect the chip bonding pads 12 of the lowermost semiconductor chip 10 of the semiconductor chips 10 to the first bond fingers 501.

The second signal transmitting units 62 of FIG. 4 may be second wires 620 that connect the second bond fingers 502 to the external terminals 40.

Referring again to FIG. 1, the redistribution paths 51 of the redistribution layers 50 of FIG. 4 change signal transmission directions and may be bent at a total angle of about 90° from the first bond fingers 501 to the second bond fingers 502.

Here, the redistribution paths 51 may not necessarily be precisely bent at a total angle of 90°. Alternatively, the redistribution paths 51 may partially be curved but may approximately form an angle of about 90°.

Figure 11:
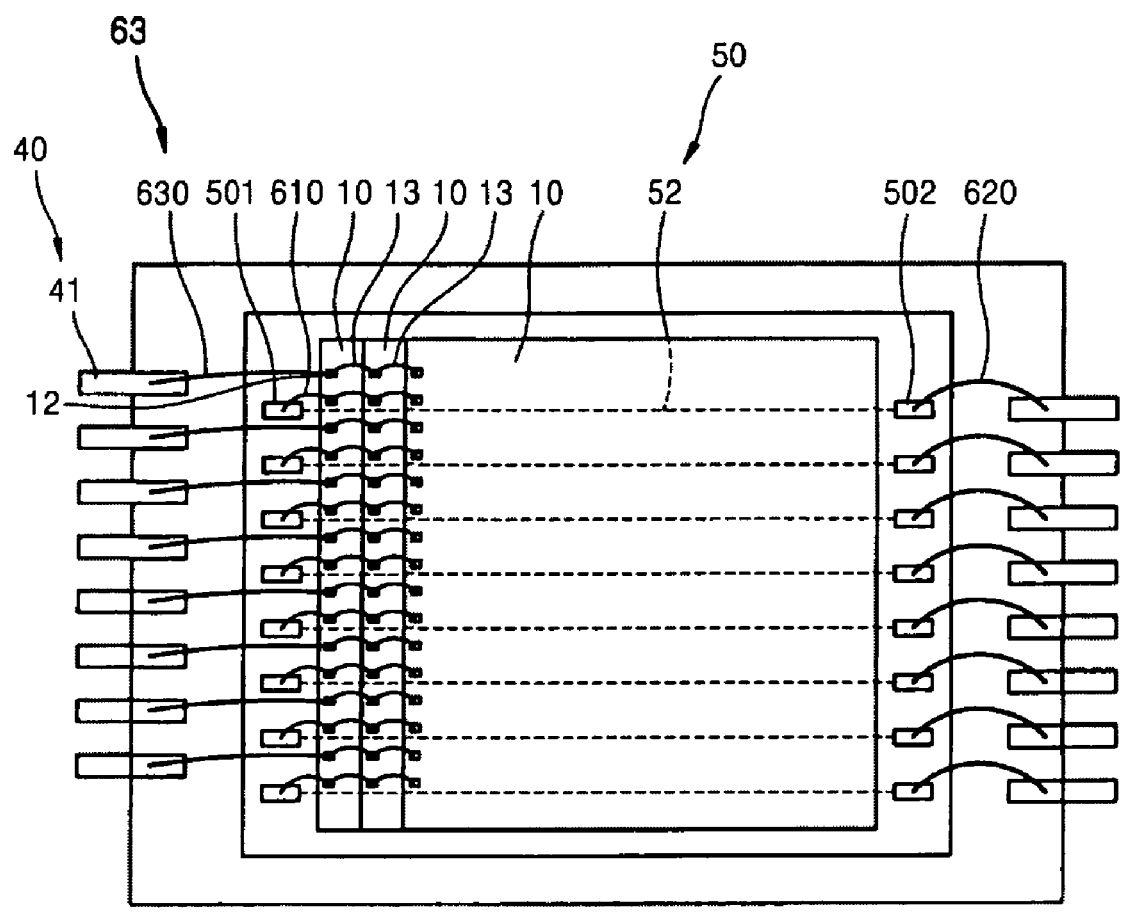
FIG. 11 is a plan view of a semiconductor package apparatus having a redistribution layer according to another exemplary embodiment of the present invention.

FIG. 11 is a plan view of a semiconductor package apparatus having a redistribution layer according to another exemplary embodiment of the present invention.

As shown in FIG. 11, a semiconductor package apparatus having a redistribution layer according to another exemplary embodiment of the present invention may further include third signal transmitting units 63 that directly transmit the electrical signals generated from the semiconductor chips 10 to the external terminals 40.

Here, the third signal transmitting units 63 may be third wires 630 that connect the chip bonding pads 12 of the lowermost semiconductor chip 10 to the external terminals 40.

Redistribution paths 52 of the redistribution layers 50 may form substantially straight lines from the first bond fingers 501 to the second bond fingers 502.

Here, the redistribution paths 52 may not be necessarily formed in precisely straight lines. That is, in some embodiments, the redistribution paths 52 may be partially curved but may approximately form straight lines.

The redistribution paths 51 and 52 may also have various shapes in other embodiments, including partial wave shapes or partial curved shapes, depending on standards, shapes, or the like of the semiconductor chips 10.

As described above, in a semiconductor package apparatus having a redistribution layer according to the present invention, stack height may be reduced. Thus, the semiconductor package apparatus may be further efficiently designed and be made relatively thin. Also, processes can be simplified to improve productivity, such as eliminating the need for a spacer tape, which may reduce the cost of parts. In addition, redistribution paths may be designed in various shapes to stack the semiconductor chips in a more complicated multi-layer structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package apparatus having a redistribution layer, comprising:
   at least a first semiconductor chip;
   a packing part configured to protect the first semiconductor chip;
   a support part disposed beneath the first semiconductor chip to support the first semiconductor chip;
   at least a first external terminal arranged to extend outside the packing part;
   at least a first redistribution layer disposed beneath the first semiconductor chip and above the support part, the first redistribution layer including at least a first redistribution path that connects a first terminal on the first redistribution layer to a second terminal on the first redistribution layer;
   wherein
      the first terminal is configured to transmit first electrical signals generated from the first semiconductor chip to the first redistribution path of the first redistribution layer;
      the second terminal is configured to transmit the first electrical signals transmitted to the first redistribution path to the first external terminal; and
      at least a portion of the first redistribution path is disposed beneath the first semiconductor chip.

2. The semiconductor package apparatus of claim 1, further comprising;
   a second semiconductor chip stacked above the first semiconductor chip in a step shape;
   a second external terminal; and
   a first pair of chip bonding pads including a first pad and a second pad, each formed along a first edge of an active surface of one of the first or second semiconductor chips respectively;
   a second pair of chip bonding pads including a first pad and a second pad, each formed along the first edge of an active surface of one of the first or second semiconductor chips respectively;
   wherein the first redistribution layer further comprises a second redistribution path that connects a third terminal on the first redistribution layer to a fourth terminal on the first redistribution layer; and
   wherein the first electrical signals transmitted from the first terminal are electrical signals transmitted through the first pair of chip bonding pads;
   wherein the third terminal is configured to transmit second electrical signals transmitted through the second pair of chip bonding pads to the second redistribution path of the first redistribution layer;
   wherein the fourth terminal is configured to transmit the second electrical signals transmitted to the second redistribution path to the second external terminal; and
wherein at least a portion of the second redistribution path is disposed beneath the first semiconductor chip.

3. The semiconductor package apparatus of claim 2,
   wherein the first pad and the second pad of the first pair of chip bonding pads are electrically connected to one another through interlayer wires; and
   wherein the first pad and the second pad of the second pair of chip bonding pads are electrically connected to one another through interlayer wires.

4. The semiconductor package apparatus of claim 2, further comprising:
   a first bond finger formed at a first end of the first redistribution path of the first redistribution layer;
   a second bond finger formed at a second end of the first redistribution path;
   a third bond finger formed at a first end of the second redistribution path of the first redistribution layer; and
   a fourth bond finger formed at a second end of the second redistribution path;
   wherein
      the first terminal comprises the first bond finger and a first wire that connects the first pair of chip bonding pads to the first bond finger;
      the second terminal comprises the second bond finger and a second wire that connects the second bond finger to the first external terminal;
      the third terminal comprises a third bond finger and a third wire that connects the second pair of chip bonding pads to the third bond finger; and
      the fourth terminal comprises a fourth bond finger and a fourth wire that connects the fourth bond finger to the second external terminal.

5. The semiconductor package apparatus of claim 4, wherein:
   the first redistribution path of the first redistribution layer is bent at a total angle of about 90 degrees from the first bond finger to the second bond finger;
   the second redistribution path of the first redistribution layer is bent at a total angle of about 90 degrees from the third bond finger to the fourth bond finger;

the portion of the first redistribution path disposed beneath the first semiconductor chip includes a portion of the first redistribution path that is bent; and the portion of the second redistribution path disposed beneath the first semiconductor chip includes a portion of the second redistribution path that is bent.

6. The semiconductor package of claim 1, wherein the support part is a die paddle that includes a metal material.

7. The semiconductor package of claim 1, wherein the support part is a PCB (printed circuit board) comprising a surface on which the first redistribution layer is formed.

8. The semiconductor package apparatus of claim 1, wherein the first redistribution layer is formed at a surface of a redistribution film.

9. The semiconductor package apparatus of claim 8, wherein the redistribution film comprises:
the first redistribution layer;
a core layer disposed beneath the first redistribution layer to support the first redistribution layer; and
a film adhesive layer arranged to attach the core layer to the support part.

10. The semiconductor package apparatus of claim 9, wherein the core layer includes a polyimide.

11. The semiconductor package apparatus of claim 8, wherein the redistribution film has a length smaller than a length of the support part so that a first and a second side of the support part contact the packing part.

12. The semiconductor package apparatus of claim 1, wherein the first redistribution layer is formed on a surface of a PCB adhered to the support part through a board adhesive layer.

13. The semiconductor package apparatus of claim 12, wherein the PCB has a length smaller than a length of the support part so that a first and a second side of the support part contact the packing part.

14. The semiconductor package apparatus of claim 1, wherein the external terminals are leads that include a metal material.

15. The semiconductor package apparatus of claim 14, wherein the leads are exposed package type leads.

16. The semiconductor package apparatus of claim 1, wherein:
a first bond finger is formed at a first end of the first redistribution path of the first redistribution layer, and a second bond finger is formed at a second end of the first redistribution layer;
the first terminal comprises the first bond finger and a first wire that connects the first chip bonding pad of the first semiconductor chip to the first bond finger; and
the second terminal comprises the second bond finger and a second wire that connects the second bond finger to the first external terminal.

17. The semiconductor package apparatus of claim 16, wherein the first redistribution path of the first redistribution layer is bent at a total angle of about 90 degrees from the first bond finger to the second bond finger; and
wherein the portion of the first redistribution path disposed beneath the first semiconductor chip includes a portion of the first redistribution path that is bent.

18. The semiconductor package apparatus of claim 1, further comprising third signal transmitting units arranged to transmit the electrical signals generated from the semiconductor chips to the external terminal.

19. The semiconductor package apparatus of claim 18, wherein the third signal transmitting units are third wires that connect the chip bonding pads of the semiconductor chip to the external terminals.

20. The semiconductor package apparatus of claim 19, wherein the redistribution paths of the redistribution layers form straight lines from the first bond fingers to the second bond fingers.

21. A semiconductor package apparatus having a redistribution layer, comprising:
at least a first semiconductor chip and a second semiconductor chip stacked on the first semiconductor chip;
a packing part configured to protect the first and second semiconductor chips;
at least a first external terminal and a second external terminal arranged to extend outside the packing part;
at least one redistribution layer disposed beneath the first semiconductor chip, the redistribution layer comprising a first redistribution path and a second redistribution path, the first redistribution path connecting a first terminal on the redistribution layer to a second terminal on the redistribution layer, the second redistribution path connecting a third terminal on the redistribution layer to a fourth terminal on the redistribution layer;
wherein:
the first terminal is configured to transmit first electrical signals generated from either of the first or second semiconductor chips to the first redistribution path;
the second terminal is configured to transmit the first electrical signals transmitted to the first redistribution path to the first external terminal;
the third terminal is configured to transmit second electrical signals generated from either of the first or second semiconductor chips to the second redistribution path;
the fourth terminal is configured to transmit the second electrical signals transmitted to the second redistribution path to the second external terminal; and
at least a portion of the first redistribution path and a parallel portion of the second redistribution path are disposed beneath the first semiconductor chip.

22. A semiconductor package apparatus having a redistribution layer, comprising:
at least a first semiconductor chip and a second semiconductor chip stacked in a plurality of layers;
a packing part configured to protect the first and second semiconductor chips;
at least a first external terminal and a second external terminal arranged to extend outside the packing part;
at least one redistribution layer disposed beneath the first semiconductor chip, the redistribution layer comprising at least a first redistribution path and a second redistribution path;
a first wire arranged to transmit first electrical signals generated from either of the first or second semiconductor chips to the first redistribution path of the redistribution layer;
a second wire arranged to transmit the first electrical signals transmitted to the redistribution paths to the first external terminal;
a third wire arranged to transmit second electrical signals generated from either of the first or second semiconductor chips to the second redistribution path; and
a fourth wire arranged to transmit the second electrical signals transmitted to the second redistribution path to the second external terminal;
wherein at least a portion of the first redistribution path and a parallel portion of the second redistribution path are disposed beneath the first semiconductor chip.

* * * * *